United States Patent
Lagler et al.

(10) Patent No.: US 10,761,134 B2
(45) Date of Patent: Sep. 1, 2020

(54) METHOD AND MEASUREMENT SYSTEM FOR IDENTIFYING THE NOISE FIGURE OF A DEVICE UNDER TEST

(71) Applicant: Rohde & Schwarz GmbH & Co. KG, Munich (DE)

(72) Inventors: Andreas Lagler, Munich (DE); Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 83 days.

(21) Appl. No.: 16/170,868

(22) Filed: Oct. 25, 2018

(65) Prior Publication Data

US 2020/0132754 A1  Apr. 30, 2020

(51) Int. Cl.
   *G01R 31/28*  (2006.01)

(52) U.S. Cl.
   CPC ................ *G01R 31/2879* (2013.01)

(58) Field of Classification Search
   CPC .... G01R 27/14; G01R 1/06788; G01R 1/025; H01R 2201/20
   USPC .......... 324/600, 649, 691, 713, 715
   See application file for complete search history.

(56) References Cited

U.S. PATENT DOCUMENTS

| | | | |
|---|---|---|---|
| 7,826,521 B1 | 11/2010 | Sun et al. | |
| 2015/0145524 A1* | 5/2015 | Duncan | G01R 31/50 |
| | | | 324/538 |
| 2016/0054370 A1* | 2/2016 | Fomin | G01R 31/312 |
| | | | 324/509 |
| 2016/0178689 A1* | 6/2016 | Okita | G01R 31/50 |
| | | | 324/509 |

OTHER PUBLICATIONS

Sivaraj, M., "Modeling Receiver Properties to Quantify the Receiver Performance," M.Sc. Thesis, University of Twente, Aug. 2016, 39 pages.
Leinonen, M.E., et al., "28 GHz Wireless Backhaul Transceiver Characterization and Radio Link Budget," ETRI Journal 40(1):89-100, Feb. 15, 2018.
Bouhamri, Z., et al., "Multistandard RoF bus for in-building networks," 2011 IEEE International Topical Meeting on Microwave Photonics, pp. 258-261, Oct. 18, 2011.

(Continued)

*Primary Examiner* — Giovanni Astacio-Oquendo
(74) *Attorney, Agent, or Firm* — Christensen O'Connor Johnson Kindness PLLC

(57) ABSTRACT

A method for identifying the noise figure of a device under test is described. A signal generator that outputs the modulated signal, a device under test and an analyzer are provided. The signal generator is connected with the analyzer directly wherein at least two error vector magnitude measurements are performed. The signal generator is connected with the device under test and the device under test is connected with the analyzer wherein at least two error vector magnitude measurements are performed. The noise contribution of the device under test is determined from the error vector magnitude measurements performed. A gain measurement is performed on the device under test. The noise figure of the device under test is calculated based on the noise contribution of the device under test obtained and the gain of the device under test obtained. Further, a measurement system is described.

17 Claims, 3 Drawing Sheets

(56) References Cited

OTHER PUBLICATIONS

Maxim Integrated Products, Tutorial 2875, Three Methods of Noise Figure Measurement, <https://www.maximintegrated.com/en/design/technical-documents/tutorials/2/2875.html> Nov. 21, 2003, 7 pages.
Hemp, B., et al. "Optimization of EVM Performance in IQ Modulators," Linear Technology, Application Note 146, May 31, 2014, 4 pages.

* cited by examiner

Measurement Application:

METHOD AND MEASUREMENT SYSTEM FOR IDENTIFYING THE NOISE FIGURE OF A DEVICE UNDER TEST

FIELD OF THE DISCLOSURE

Embodiments of the present disclosure generally relate to a method for identifying the noise figure of a device under test using a modulated signal. Further, embodiments of the present disclosure generally relate to a measurement system for identifying the noise figure of a device under test using a modulated signal.

BACKGROUND

The noise figure is a measure that is of interest for characterizing the behavior of a device under test under operation, for instance a communication device such as a user end device or any other signal processing device.

In the state of the art, the noise figure of the device under test is typically measured by using an external noise source that provides a pseudo-noise signal for simulating noise wherein a noise power is measured. In those approaches, a cold noise power has to be produced and measured, namely a noise signal at a very low power level. The noise source may be established by a programmable radio frequency source that is operated to produce the pseudo-noise, for instance a white Gaussian noise, also called WGN.

However, the approaches known in the prior art relate to an artificial measurement approach since a noise source is simulated which is used for characterizing the noise figure of the device under test that differs from the real operating conditions. Therefore, the result of those measurements may have limited relevance or reliability.

Accordingly, there is a need for a method as well as a measurement system ensuring identification of the noise figure of a device under test in a cost-efficient and reliable manner.

SUMMARY

Embodiments of the present disclosure generally provide a method for identifying the noise figure of a device under test using a modulated signal, comprising:
providing a signal generator that outputs the modulated signal, a device under test and an analyzer; connecting the signal generator with the analyzer directly, and performing at least two error vector magnitude measurements with different average counts; connecting the signal generator with the device under test and connecting the device under test with the analyzer directly, and performing at least two error vector magnitude measurements with different average counts; determining the noise contribution of the device under test from the error vector magnitude measurements performed; performing a gain measurement on the device under test; and calculating the noise figure of the device under test based on the noise contribution of the device under test obtained and the gain of the device under test obtained.

Further, embodiments of the present disclosure generally relate to a measurement system for identifying the noise figure of a device under test using a modulated signal, the measurement system comprising a signal generator that outputs the modulated signal, a device under test and an analyzer, the measurement system having at least two different measurement setups in which different measurements can be performed: the signal generator is directly connected with the analyzer in a first measurement setup; the signal generator is directly connected with the device under test as well as the device under test is directly connected with the analyzer in a second measurement setup. The measurement system is configured to measure the noise contribution of the signal generator and the analyzer in the first measurement setup, and the measurement system being configured to measure the noise contribution of the signal generator, the device under test and the analyzer in the second measurement setup.

Accordingly, a full characterization of the measurement results in terms of noise is possible since different measurements or rather measurement setups are used so that the error (noise) contribution, namely the additive noise, of the device under test can be determined. The noise contribution is used in addition to the gain of the device under test measured for calculating the noise figure of the device under test.

In embodiments of the present disclosure, systematic signal errors as well as noise contributions can be separated from each other since the respective error vector magnitude (EVM) measurements in the respective measurement setup are done with different average counts. These EVM measurements can be, for example, compared with each other so as to separate the systematic signal errors as well as noise contributions respectively. Thus, systematic errors can be identified by comparing the respective measurement results so as to separate the systematic signal errors due to the different average counts used for the different measurements. In general, the average count determines the number of averaging procedures used. The average count is also related to the I/Q average count so that I/Q averaged EVM is measured since an error vector is a vector in the I-Q plane between the ideal constellation and the real one measured.

In some embodiments, the systematic signal errors are separated from the noise contribution(s) by comparing the EVM measurements wherein the noise can be reduced by a known factor that depends on the respective average count applied. The higher the number of averaging procedures, the lower the noise.

Accordingly, it is assumed that all random error contributions, namely the ones being different to the systematic signal errors, are thermal noise.

Moreover, a modulated signal is used for performing the respective measurements so that the device under test is tested under real operation conditions, namely real application environment, which means that a real-world signal is used to test the device under test under real operating conditions. This is contrary to pseudo-noise signals such as White Gaussian Noise used for testing the device under test as it is done in the prior art. In some embodiments, the error vector magnitude is measured so that it is not necessary to measure any very low power levels, also called cold powers. Thus, a freely configurable drive level for the measurement is provided. Accordingly, the noise contribution of the device under test can be measured under real operating conditions.

Furthermore, the measurement uncertainty can be decreased by repeating the respective measurement with another device that exceeds the measurement uncertainty of the analyzer. For instance, a separately formed power sensor may be used.

The noise figure (of the device under test), also called noise factor, may equal the outgoing noise power divided by the product of the gain (of the device under test) and the ingoing noise power. The noise figure is a measure of degradation of the signal-to-noise ratio (SNR) that is caused by components in a signal chain tested, namely the one of the respective measurement setup.

According to an aspect, the noise contribution of the analyzer is measured directly. Hence, the noise contribution of each component of the measurement system may be measured or at least derived from the different measurements performed. The noise contribution of the analyzer may be measured directly whereas the noise contribution of the signal generator may be obtained by comparing the noise contribution of the analyzer measured directly as well as the noise contribution measured of the signal generator and the analyzer.

For instance, the noise contribution of the analyzer is measured by connecting a match with the analyzer and measuring the noise power. The match has pre-known characteristics. Thus, the noise power may be measured in the I/Q analyzer so that noise measured corresponds to a thermal noise floor of the analyzer. Having measured the noise contribution of the analyzer, absolute noise figures of the individual components of the measurement system can be determined easily since the noise floor is known.

According to an aspect, the noise contribution of the signal generator and the analyzer is measured when the signal generator is connected with the analyzer directly. Hence, the noise contribution, namely the sum of the noise contributions of the signal generator and the analyzer, can be derived from the measurement directly. The individual noise contribution of the signal generator may be derived by comparing the noise contribution of the analyzer measured directly as well as the noise contribution of the signal generator and the analyzer which is measured in the first measurement setup.

According to another aspect, the noise contribution of the signal generator, the device under test and the analyzer is measured when the signal generator is connected with the device under test directly and the device under test is connected with the analyzer directly. The noise contribution measured relates to the sum of the individual noise contributions of the components of the measurement system used in the respective measurement setup, namely the individual noise contributions of the signal generator, the device under test and the analyzer.

In some embodiments, the noise contribution of the signal generator and the analyzer obtained, namely the noise contribution measured directly in the first measurement setup, is compared with the noise contribution of the signal generator, the device under test and the analyzer, namely the noise contribution directly measured in the second measurement setup, so as to obtain the noise contribution of the device under test. Both measurements are done by having different measurement setups which distinguish from each other in that the device under test is interconnected between the signal generator and the analyzer. Thus, the (individual) noise contribution of the device under test can be easily derived from a comparison of the noise contributions measured directly in the different measurement setups.

In embodiments of the present disclosure, the different average counts for the error vector magnitude measurements are assigned to an average count of 1 and an average count higher than 1. Thus, the systematic signal errors can be separated from the random noise, namely the noise contribution(s), in an easy manner by comparing the respective error vector magnitude measurements which are done at least twice with different average counts for the respective measurement setup.

The noise figure of the device under test may be calculated only based on the noise contribution of the device under test obtained and the gain of the device under test obtained. Thus, it is not necessary to take any other measurement into account once the noise contribution of the device under test and the gain of the device under test has been determined.

According to another aspect, the same signal path of the analyzer is used for the different measurements performed. This ensures that the different measurement results can be compared with each other effectively since the same signal path of the analyzer is used for all measurements so that deviations due to different signal paths do not occur.

The analyzer may also receive the modulated signal provided by the signal generator as a reference signal. The analyzer takes the modulated signal, namely the reference signal, into account for calculating the respective error vector magnitude of the modulated signal processed by the device under test.

In some embodiments, the signal generator may be integrated in the analyzer so that a common device is provided that encompass the signal generator and the analyzer.

According to an aspect, the measurement system is configured to compare the noise contribution obtained in the first measurement setup with the noise contribution obtained in the second measurement setup so as to determine the noise contribution of the device under test. As mentioned above, the second measurement setup distinguishes from the first measurement setup in that the device under test is interconnected between the signal generator and the analyzer. Thus, the noise contributions measured directly in the different measurement setups can be compared with each other to determine the impact of the device under test on the overall noise contribution in the second measurement setup. In other words, the comparison yields in determining the noise contribution of the device under test.

Another aspect provides that the measurement system is further configured to measure the gain of the device under test. For instance, the analyzer may receive the modulated signal that is processed by the device under test as well as the modulated signal from the signal generator directly so that the processed signal and the reference signal may be compared with each other, for example synchronized with regard to I/Q data, so that the gain of the device under test can be measured.

Moreover, the measurement system may be configured to calculate the noise figure of the device under test based on the noise contribution of the device under test obtained and the gain of the device under test obtained. Therefore, the noise figure can be measured easily by using a real-world signal, namely the modulated signal provided by the signal generator, so that it is not necessary to use an artificial noise source for simulating noise.

Furthermore, a match may be provided that is directly connected with the analyzer in a third measurement setup, the measurement system being configured to measure the noise contribution of the analyzer in the third measurement setup. In the third measurement setup, the noise power can be measured directly wherein the noise power measured relates to a thermal noise floor of the analyzer. Therefore, a global characterization of the measurements in terms of noise can be achieved since three separate measurements of the components used for testing the device under test are performed.

Therefore, the overall noise of the measurement system can be split into the respective error (noise) contributions of each component of the measurement system, namely the noise contribution of the analyzer, the noise contribution of the signal generator as well as the noise contribution of the device under test.

As already described, the noise contribution of the device under test is taken into account, in addition to the gain of the device under test, to calculate the noise figure of the device under test.

In some embodiments, the noise figures of all components may be calculated since the respective noise contributions can be determined as described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
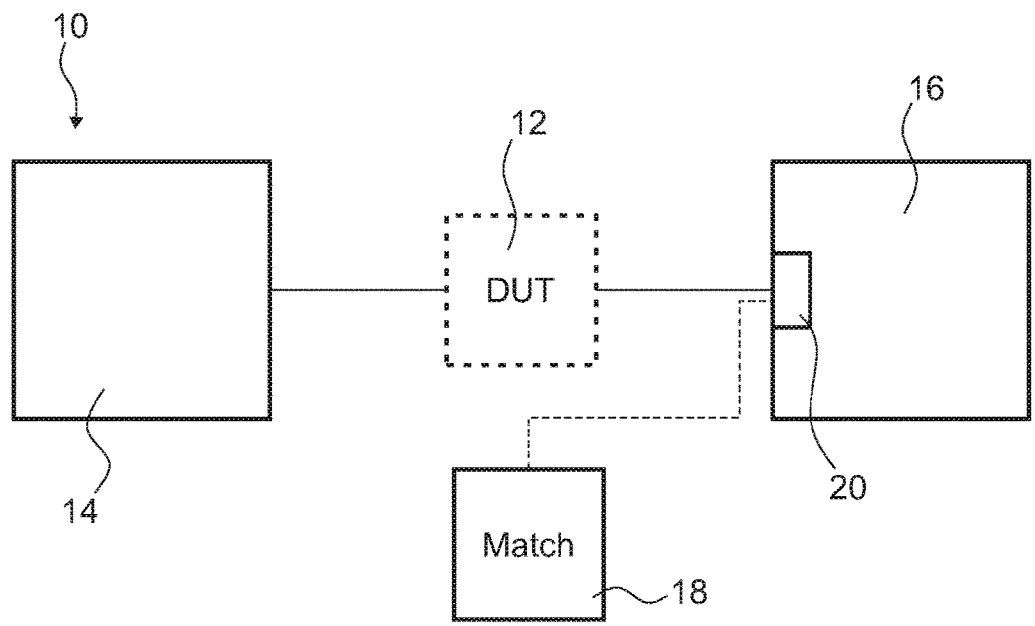
FIG. 1 schematically shows a representative example of a measurement system according to the present disclosure.

In FIG. 1, a measurement system 10 is shown that is used for identifying the noise figure of a device under test 12, also called DUT, that is part of the measurement system 10. In addition to the device under test 12, the measurement system 10 comprises a signal generator 14, an analyzer 16, and a match 18. Accordingly, the measurement system 10 comprises several components, namely the device under test 12, the signal generator 14, the analyzer 16 and the match 18. These components may generally be, in some embodiments, established by hardware components.

These different components of the measurement system 10 can be interconnected in different ways thus establishing different measurement setups. The measurement setups can be used for performing different measurements used for deriving at the noise figure of the device under test 12.

Figure 5:
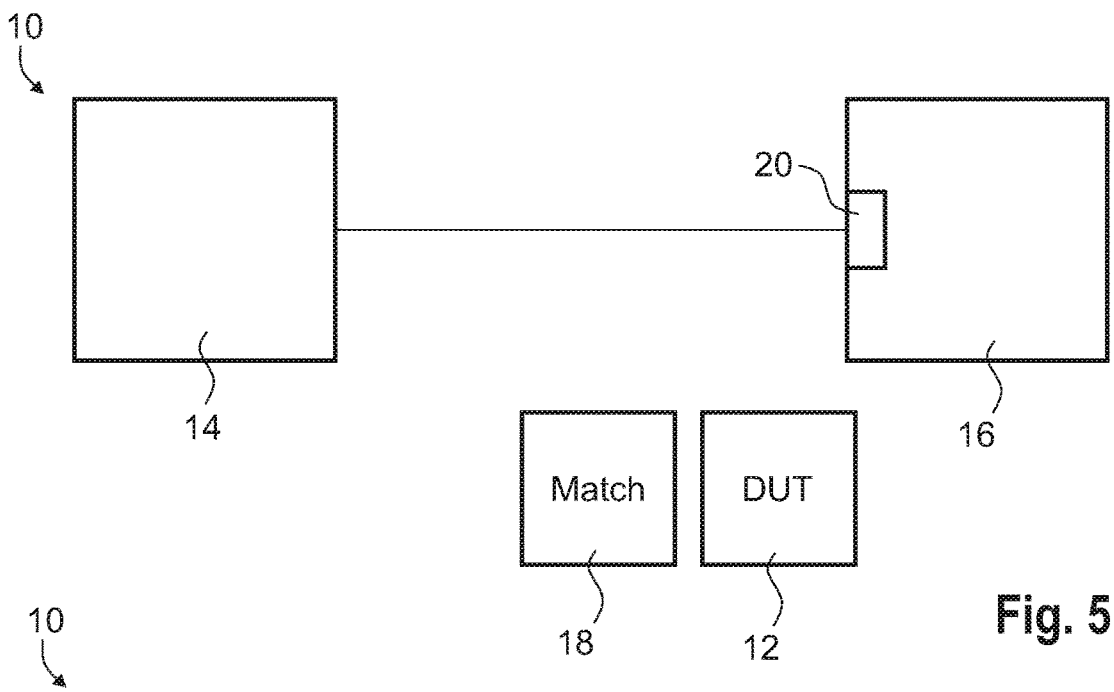
FIG. 5 schematically shows a representative example of a measurement system according to the present disclosure in a first measurement setup.

In a first measurement setup (shown in FIG. 5), the signal generator 14 is directly connected with the analyzer 16 so that the signal generated by the signal generator 14 is directly forwarded to an input 20 of the analyzer 16 for analyzing purposes. Thus, the device under test 12 is illustrated by dashed lines in FIG. 1 since the signal generator 14 may be directly connected with the analyzer 16.

Figure 6:
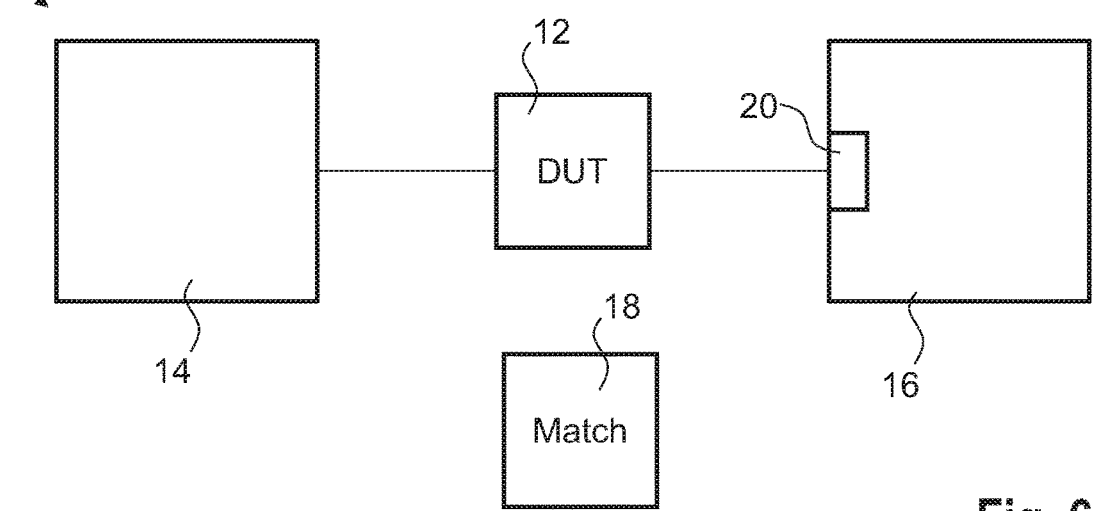
FIG. 6 schematically shows a representative example of a measurement system according to the present disclosure in a second measurement setup.

In a second measurement setup (shown in FIG. 6), the signal generator 14 is directly connected with the device under test 12 wherein the device under test 12 is directly connected with the analyzer 16. In other words, the device under test 12 is interconnected between the signal generator 14 and the analyzer 16.

Thus, the signal generator 14 generates a modulated signal that is forwarded to the device under test 12 which internally processes the modulated signal generated by the signal generator 14 and outputs a processed signal to the analyzer 16 that analyzes the processed signal appropriately. This signal model is generally shown in FIG. 2.

Figure 7:
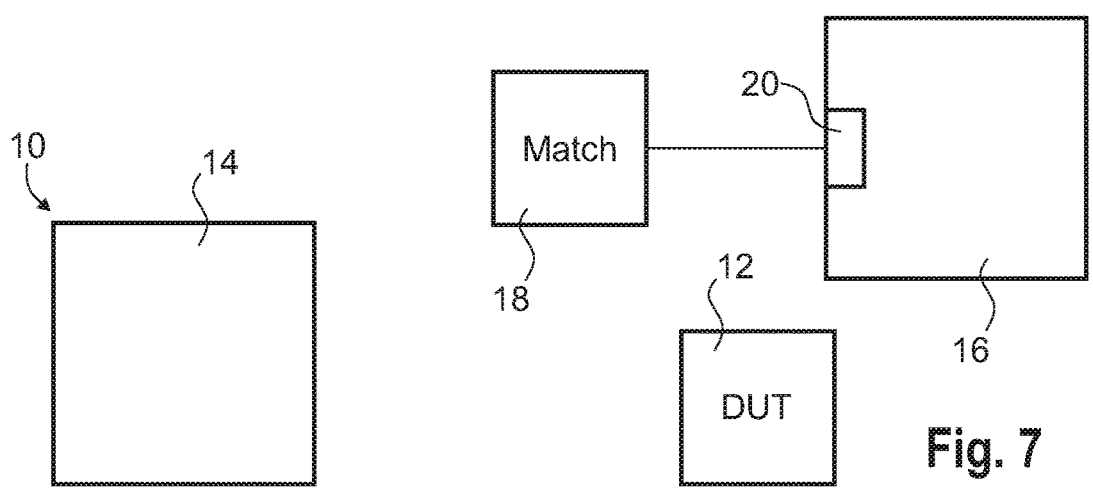
FIG. 7 schematically shows a representative example of a measurement system according to the present disclosure in a third measurement setup.

In a third measurement setup (shown in FIG. 7), the match 18 is directly connected with the analyzer 16 so that no signal generator 14 as wells as no device under test 12 is connected with the analyzer 16. This connection is also illustrated by the dashed lines connecting the match 18 and the analyzer 16, namely its input 20. In the third measurement setup, the inherent characteristics of the analyzer 16 can be determined since it is only coupled with the match 18 having predefined characteristics. A noise floor of the analyzer 16 may be determined in the third measurement setup since the analyzer 16 is the only component of the measurement system 10 having unknown characteristics.

Figure 2:
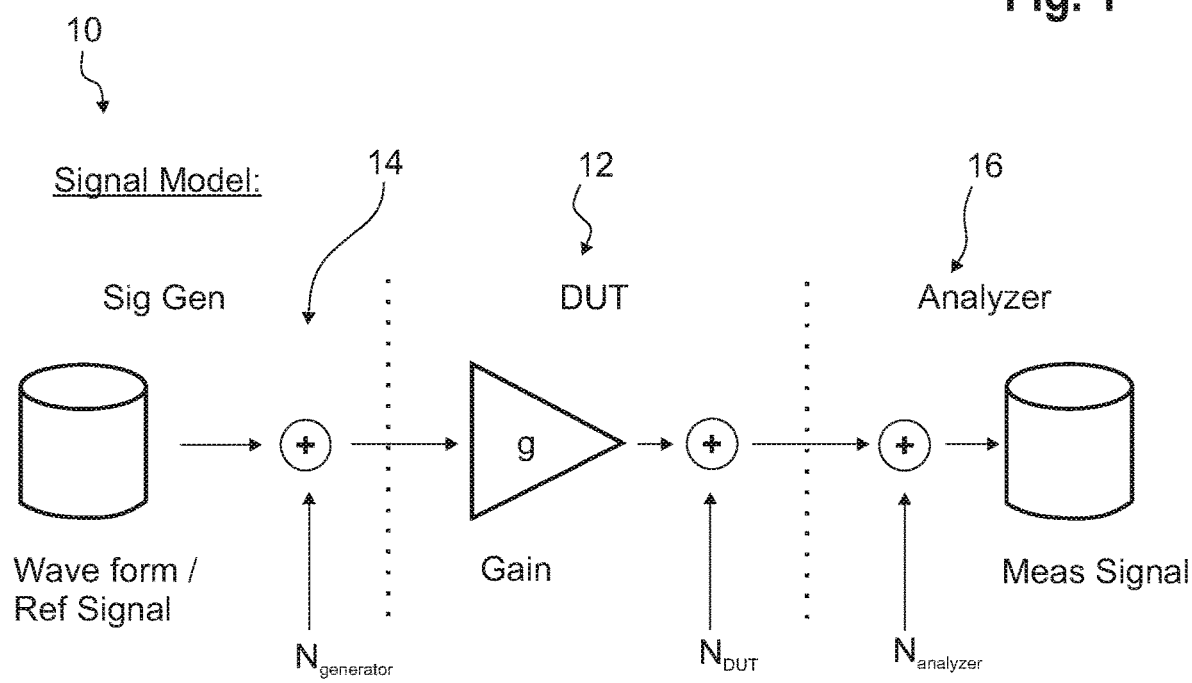
FIG. 2 schematically shows an overview of a signal model used by a measurement system according to the present disclosure.

As already mentioned, FIG. 2 illustrates the second measurement setup in a different way as a signal model is shown. This illustration reveals that each component of the measurement system 10, namely the signal generator 14, the device under test 12 as well as the analyzer 16, have a certain (random) noise contribution to the overall noise measured in the respective measurement system 10 in the second measurement setup. The respective noise contribution is indicated by $N_x$ in FIG. 2 whereas a gain of the device under test 12 is indicated by "g" in a schematically shown amplifier assigned to the device under test 12.

Figure 3:
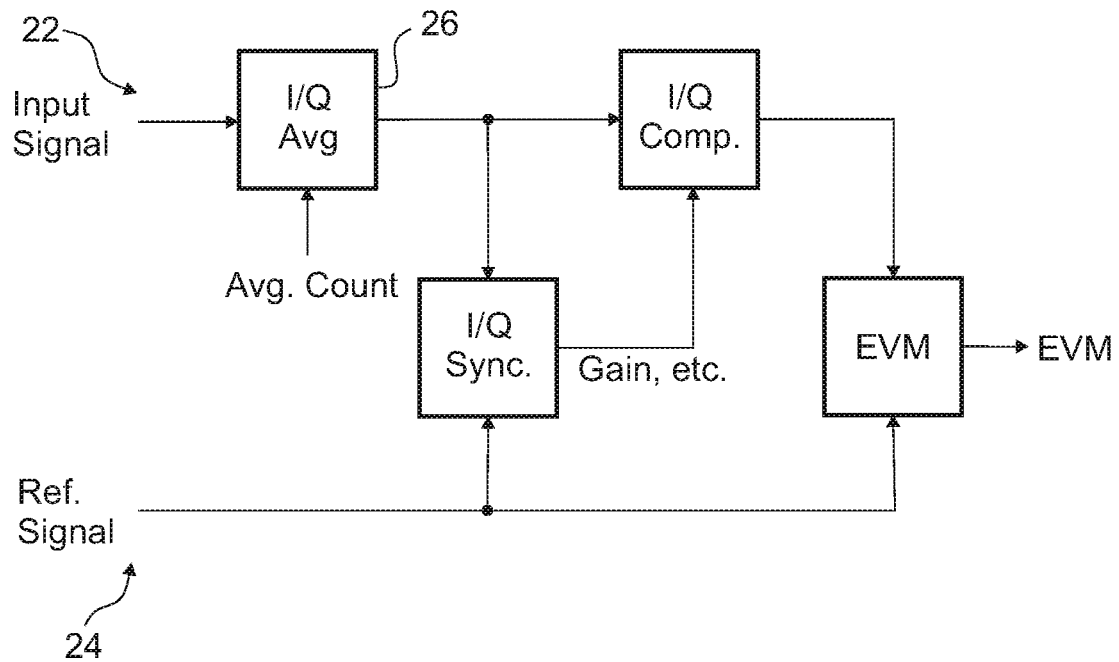
FIG. 3 schematically shows an overview of a measurement application used by a measurement system according to the present disclosure.

As further illustrated in FIG. 3, the analyzer 16 or rather the measurement application used by the analyzer 16 receives an input signal 22, for instance the processed signal from the device under test 12 or the modulated signal from the signal generator 14, as well as a reference signal 24 that may correspond to the modulated signal. The input signal 22 as well as the reference signal 24 are processed by the analyzer 16 for analyzing purposes so that the error vector magnitude (EVM) can be measured by the analyzer 16 appropriately.

Generally, the input signal 22 is averaged in an I/Q average unit 26 wherein the number of averaging procedures are counted appropriately so as to obtain an average count. Moreover, the input signal 22 as well as the reference signal 24 are used for I/Q synchronization wherein a gain of the input signal 22 is determined, for instance. Gain and phase imbalance may be determined which can be used for I/Q compensation of the input signal 22. In addition, the error vector magnitude (EVM) may be determined by taking the input signal 22, for example the I/Q compensated input signal 22, as well as the reference signal 24 into account.

Figure 4:
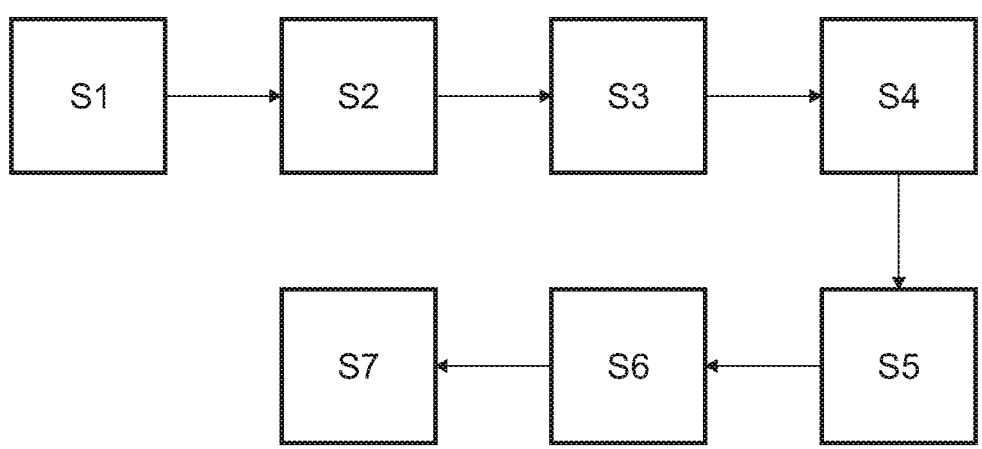
FIG. 4 schematically shows an overview illustrating a representative method for identifying the noise figure of a device under test according to the present disclosure.

In addition, the analyzer 16 may also receive the modulated signal outputted by the signal generator 14 in the first measurement setup wherein the respective modulated signal is compared with a reference signal so as to determine the error vector magnitude in the first measurement setup as will be described hereinafter with reference to FIG. 4 illustrating a method for identifying the noise figure of the device under test 12 using the modulated signal, namely a real world signal that is used under real operation conditions.

In a first step S1, a signal generator 14, a device under test 12 as well as an analyzer 16 are provided.

In a second step S2, the signal generator 14 is directly connected with the analyzer 16 so that the first measurement setup is provided. Then, at least two error vector magnitude measurements with different average counts are performed and compared with each other to separate systematic signal errors and noise contribution. Therefore, the noise contribution in the first measurement setup can be determined since at least two error vector magnitude measurements with different average counts are performed wherein the different average counts for the vector magnitude measurements are assigned to an average count of 1 and an average count higher than 1. This ensures that the systematic signal errors can be separated from the noise contribution(s). The averaging, namely the number of averaging procedures, applied reduces the noise by a known factor that in turn depends on the respective average count applied.

Thus, the overall noise contribution of the components used in the first measurement setup, namely the analyzer 16 and the signal generator 14, can be determined.

In a third step S3, the signal generator 14 is directly connected with the device under test 12 wherein the device under test 12 is further directly connected with the analyzer 16. In other words, the device under test 12 is interconnected between the signal generator 14 and the analyzer 16 in accordance with the signal model shown in FIG. 2. Again, at least two error vector magnitude measurements are performed with different average counts and compared with each other to separate the systematic signal errors and noise contribution of the measurement system 10 in the second measurement setup.

Thus, the overall noise contribution of the components used in the second measurement setup, namely the analyzer 16, the device under test 12 and the signal generator 14, can be determined.

Accordingly, the noise contribution of the signal generator 14 and the analyzer 16 is measured in the first measurement setup (step S2) whereas the noise contribution of the signal generator 14, the device under test 12 and the analyzer 16 is measured in the second measurement setup (step S3). In other words, the sums of the individual noise contributions of the respective components used in the respective measurement setups are determined.

In a fourth step S4, the (individual) noise contribution of the device under test 12 can be determined from the error vector magnitude measurements performed. For doing so, the noise contribution of the signal generator 14, the device under test 12 and the analyzer 16 obtained in step S3 may be compared with the noise contribution of the signal generator 14 and the analyzer 16 obtained in step S2. The comparison yields in the noise contribution of the device under test 12 since the first measurement setup and the second measurement setup distinguishes from each other in the incorporation of the device under test 12.

In a fifth step S5, a gain measurement on the device under test 12 is performed so as to obtain the gain of the device under test 12. The gain measurement may be performed by the analyzer 16 in the second measurement setup in which the device under test 12 is connected to the analyzer 16.

In a sixth step S6, the noise figure of the device under test 12 is calculated based on the noise contribution of the device under test 12 obtained in step S4 and the gain of the device under test 12 obtained in step S5. The noise figure of the device under test 12, for example, is calculated only based on the noise contribution of the device under test 12 and the gain of the device under test 12. Thus, no other measurement is required for determining the noise figure of the device under test 12.

As mentioned above, the noise contribution of the device under test 12 may be derived from the comparison done in step S4 whereas the gain of the device under test 12 is obtained in step S5.

In a seventh step S7, the noise contribution of the analyzer 16 can be measured directly wherein the seventh step may also be performed earlier so that a thermal noise floor of the analyzer 16 is obtained. For instance, the noise contribution of the analyzer 16 is measured by connecting the match 18 having known characteristics to the analyzer 16 directly wherein the noise power is measured.

Accordingly, a full characterization of the measurement in terms of noise can be achieved since the noise contributions of each individual component of the measurement system 10 can be derived from the measurements performed.

Generally, the different average counts for the error vector magnitude measurements may be assigned to an average count of 1 and an average count higher than 1. This ensures that the systematic signal errors can be separated from noise contribution(s) when comparing the measurement results obtained by the error vector magnitude measurements having different average counts.

In all measurement setups, the same input 20 of the analyzer 16 may be used. Thus, the same signal path of the analyzer 16 is used for receiving the respective input signal 22.

Therefore, a method as well as a measurement system 10 are provided that can be used for identifying the noise figure of the device under test 12 in an easy, cost-efficient and reliable manner since each component of the measurement system 10 is analyzed with regard to its individual noise contribution wherein real-world signals are used for obtaining the respective noise figure of the device under test 12.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for identifying the noise figure of a device under test using a modulated signal, comprising:
   providing a signal generator that outputs the modulated signal, a device under test and an analyzer;
   connecting the signal generator with the analyzer directly, and performing at least two error vector magnitude measurements with different average counts;
   connecting the signal generator with the device under test and connecting the device under test with the analyzer directly, and performing at least two error vector magnitude measurements with different average counts;

determining the noise contribution of the device under test from the error vector magnitude measurements performed;

performing a gain measurement on the device under test; and calculating the noise figure of the device under test based on the noise contribution of the device under test obtained and the gain of the device under test obtained.

2. The method of claim 1, wherein the noise contribution of the analyzer is measured directly.

3. The method of claim 2, wherein the noise contribution of the analyzer is measured by connecting a match with the analyzer and measuring noise power.

4. The method of claim 1, wherein the noise contribution of the signal generator and the analyzer is measured when the signal generator is connected with the analyzer directly.

5. The method of claim 4, wherein the noise contribution of the signal generator and the analyzer obtained is compared with the noise contribution of the signal generator, the device under test and the analyzer so as to obtain the noise contribution of the device under test.

6. The method of claim 1, wherein the noise contribution of the signal generator, the device under test and the analyzer is measured when the signal generator is connected with the device under test directly and the device under test is connected with the analyzer directly.

7. The method of claim 6, wherein the noise contribution of the signal generator and the analyzer obtained is compared with the noise contribution of the signal generator, the device under test and the analyzer so as to obtain the noise contribution of the device under test.

8. The method of claim 1, wherein the different average counts for the vector magnitude measurements are assigned to an average count of 1 and an average count higher than 1.

9. The method of claim 1, wherein the noise figure of the device under test is calculated only based on the contribution of the device under test obtained and the gain of the device under test obtained.

10. The method of claim 1, wherein the same signal path of the analyzer is used for the different measurements performed.

11. The method of claim 1, wherein the analyzer also receives the modulated signal provided by the signal generator as a reference signal.

12. A measurement system for identifying the noise figure of a device under test using a modulated signal, the measurement system comprising:

a signal generator that outputs the modulated signal;
a device under test; and
an analyzer,
wherein the measurement system is configured with at least two different measurement setups in which different measurements can be performed:
the signal generator is directly connected with the analyzer in a first measurement setup;
the signal generator is directly connected with the device under test as well as the device under test is directly connected with the analyzer directly in a second measurement setup;
the measurement system being configured to measure the noise contribution of the signal generator and the analyzer in the first measurement setup, and the measurement system being configured to measure the noise contribution of the signal generator, the device under test and the analyzer in the second measurement setup.

13. The measurement system of claim 12, wherein the measurement system is configured to compare the noise contribution obtained in the first measurement setup with the noise contribution obtained in the second measurement setup so as to determine the noise contribution of the device under test.

14. The measurement system of claim 13, wherein the measurement system is configured to calculate the noise figure of the device under test based on the noise contribution of the device under test obtained and the gain of the device under test obtained.

15. The measurement system of claim 12, wherein the measurement system is further configured to measure the gain of the device under test.

16. The measurement system of claim 15, wherein the measurement system is configured to calculate the noise figure of the device under test based on the noise contribution of the device under test obtained and the gain of the device under test obtained.

17. The measurement system of claim 12, wherein a match is provided that is directly connected with the analyzer in a third measurement setup, the measurement system being configured to measure the noise contribution of the analyzer in the third measurement setup.

* * * * *